United States Patent
Inukai

(10) Patent No.: US 9,667,208 B2
(45) Date of Patent: May 30, 2017

(54) CLASS-D AMPLIFIER AND ELECTRONIC APPARATUS

(71) Applicant: KYOCERA Corporation, Kyoto (JP)

(72) Inventor: Tsuneyasu Inukai, Ogaki (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 14/833,546

(22) Filed: Aug. 24, 2015

(65) Prior Publication Data

US 2015/0365059 A1    Dec. 17, 2015

Related U.S. Application Data

(63) Continuation of application No. PCT/JP2014/054472, filed on Feb. 25, 2014.

(30) Foreign Application Priority Data

Feb. 26, 2013    (JP) .................................. 2013-035304

(51) Int. Cl.
*H03F 3/217* (2006.01)
*H03F 3/21* (2006.01)
(Continued)

(52) U.S. Cl.
CPC ........... *H03F 3/217* (2013.01); *H03F 1/0205* (2013.01); *H03F 1/0211* (2013.01); *H03F 3/185* (2013.01);
(Continued)

(58) Field of Classification Search
CPC  H04R 3/00; H04R 17/00; H03F 3/211; H03F 3/217; H03F 3/2171; H03F 3/2173;
(Continued)

(56) References Cited

U.S. PATENT DOCUMENTS 5,767,740 A * 6/1998 Fogg ..................... H03F 3/2173
                                                        330/10
6,127,885 A * 10/2000 Colangelo ............... H03F 3/217
                                                        330/10
(Continued)

FOREIGN PATENT DOCUMENTS

JP    H05-314446 A    11/1993
JP    2003-500992 A    1/2003
(Continued)

OTHER PUBLICATIONS

International Search Report dated Jun. 3, 2014, issued for International Application No. PCT/JP2014/054472.
(Continued)

*Primary Examiner* — Vivian Chin
*Assistant Examiner* — Jason R Kurr
(74) *Attorney, Agent, or Firm* — Procopio Cory Hargreaves and Savitch LLP

(57) ABSTRACT

Disclosed is a class-D amplifier including a first output circuit, a first capacitor, a pulse width modulator, and a slew rate limiting amplifier. The first output circuit includes first and second switching devices that are connected in series between first and second power supply lines. The first capacitor is connected between the first and second power supply lines. The pulse width modulator generates a pulse width modulated switching signal based on a triangular wave and an audio signal, and provides the switching signal to the first output circuit. The slew rate limiting amplifier is connected to an input part of the pulse width modulator to which the audio signal is provided, and limits a slew rate of output. The sound-producing device is connected in series to an inductor connected to a first output node of the first output circuit. The sound-producing device and the inductor constitute an LC filter.

4 Claims, 6 Drawing Sheets

(51) Int. Cl.
  *H03F 3/45* (2006.01)
  *H03F 1/02* (2006.01)
  *H03F 3/185* (2006.01)
  *H04R 3/00* (2006.01)
  *H04R 17/00* (2006.01)

(52) U.S. Cl.
  CPC .......... *H03F 3/1855* (2013.01); *H03F 3/211* (2013.01); *H03F 3/2171* (2013.01); *H03F 3/2173* (2013.01); *H03F 3/45475* (2013.01); *H04R 3/00* (2013.01); *H04R 17/00* (2013.01); *H03F 2200/03* (2013.01); *H03F 2200/351* (2013.01); *H03F 2200/411* (2013.01); *H03F 2203/21106* (2013.01); *H03F 2203/45512* (2013.01); *H03F 2203/45528* (2013.01); *H03F 2203/45552* (2013.01); *H03F 2203/45568* (2013.01); *H03F 2203/45571* (2013.01); *H03F 2203/45594* (2013.01)

(58) Field of Classification Search
  CPC .... H03F 3/2178; H03F 1/0205; H03F 1/0211; H03F 3/181; H03F 3/185; H03F 3/1855; H03F 3/45475; H03F 2200/03; H03F 2200/351; H03F 2200/411; H03F 2203/21106; H03F 2203/45512; H03F 2203/45528; H03F 2203/45552; H03F 2203/45568; H03F 2203/45571; H03F 2203/45594
  USPC .............. 381/120; 330/207 A, 251, 255, 10
  See application file for complete search history.

(56) References Cited

U.S. PATENT DOCUMENTS

| | | | | |
|---|---|---|---|---|
| 6,597,240 | B1* | 7/2003 | Walburger | ............ H03F 3/2171 330/10 |
| 6,762,645 | B1* | 7/2004 | Grant | ....................... H03F 3/19 323/282 |
| 7,221,216 | B2* | 5/2007 | Nguyen | ................... H03F 1/32 330/10 |

FOREIGN PATENT DOCUMENTS

| | | |
|---|---|---|
| JP | 2006-094158 A | 4/2006 |
| JP | 2006-197152 A | 7/2006 |
| JP | 2008-113424 A | 5/2008 |
| WO | 00/72617 A2 | 11/2000 |

OTHER PUBLICATIONS

Written Opinion of the International Searching Authority issued by Japan Patent Office for International Application No. PCT/JP2014/054472.

Office Action dated Jan. 10, 2017 issued by the Japanese Patent Office in Counterpart Japanese Application No. 2013-035304.

* cited by examiner

F I G . 3
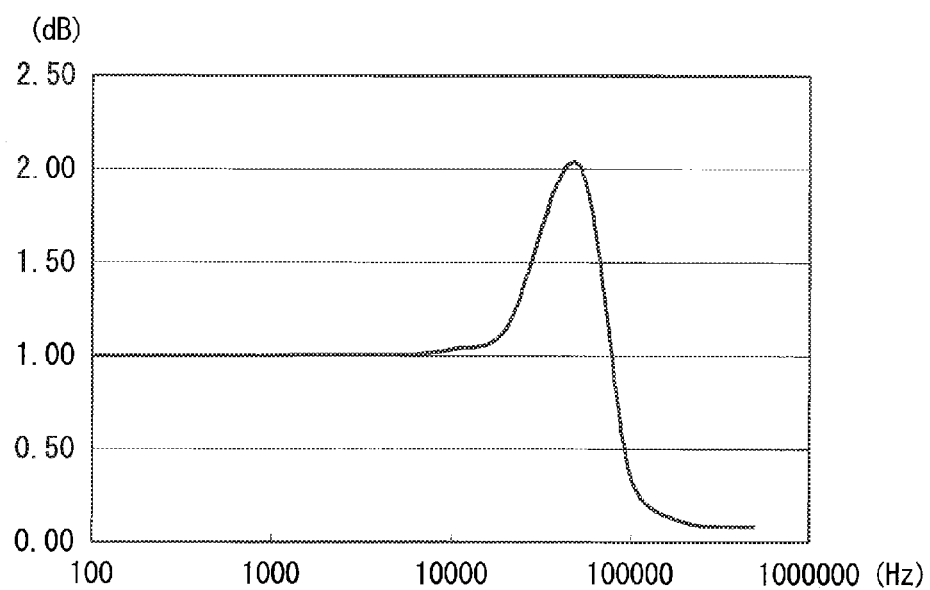
F I G . 4
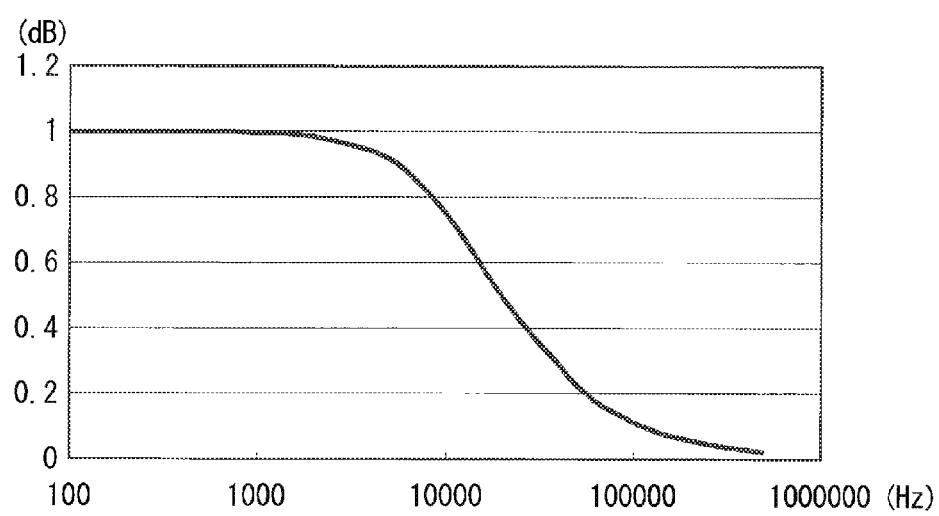

CLASS-D AMPLIFIER AND ELECTRONIC APPARATUS

CROSS-REFERENCE TO RELATED APPLICATIONS

The present application is a continuation of International Application No. PCT/JP2014/054472, filed on Feb. 25, 2014, which claims the benefit of Japanese Patent Application No. 2013-035304, filed on Feb. 26, 2013. Both International Application No. PCT/JP2014/054472 and Japanese Patent Application No. 2013-035304 are entitled "D-CLASS AMPLIFIER AND ELECTRONIC APPARATUS". The contents of these applications are incorporated herein by reference in their entirety.

FIELD

Embodiments of the present disclosure relate to class-D amplifiers, and, in particular, to a class-D amplifier that drives a sound-producing device (speaker and receiver) serving as a capacitive load, such as a piezoelectric element and an electrostatic loudspeaker.

BACKGROUND

A class-D amplifier in which output stage transistors perform switching operation is increasingly being used as a drive circuit that drives a sound-producing device, such as a piezoelectric element and an electrostatic loudspeaker.

The class-D amplifier includes, as an output device, MOSFETs having a low on-resistance, and causes the MOSFETs to perform switching operation to reduce loss in the output device.

In the class-D amplifier, the loss in the output device is smaller than that in an analog amplifier, and a radiator can be omitted or reduced in size. The class-D amplifier can achieve a small and high-power amplifier, and thus can be used as an amplifier for a mobile terminal.

Output of the output device of the class-D amplifier has a switching waveform, and is thus supplied to a load after a low-pass filter (LPF) eliminates switching carrier components therefrom.

SUMMARY

A class-D amplifier and an electronic apparatus are disclosed. In one embodiment, a class-D amplifier drives a sound-producing device serving as a capacitive load, and includes a first output circuit, a first capacitor, a pulse width modulator, and a slew rate limiting amplifier. The first output circuit includes a first switching device and a second switching device that are connected in series between a first power supply line and a second power supply line, and complementarily operate. The first power supply line provides first potential, and the second power supply line provides second potential lower than the first potential. The first capacitor is connected between the first power supply line and the second power supply line. The pulse width modulator generates a pulse width modulated switching signal based on a triangular wave and an audio signal, and provides the switching signal to the first output circuit. The slew rate limiting amplifier is connected to an input part of the pulse width modulator to which the audio signal is provided, and limits a slew rate of output. The sound-producing device is connected in series to an inductor connected to a first output node of the first output circuit. The sound-producing device and the inductor constitute an LC filter.

In one embodiment, an electronic apparatus includes the class-D amplifier as described above.

BRIEF DESCRIPTION OF DRAWINGS

FIG. 3 illustrates frequency characteristics of the class-D amplifier when a signal having the same frequency component as resonance frequency is input.

FIG. 4 illustrates operating characteristics of a low-pass filter having frequency characteristics of cutting signal components at and around a frequency of 50 kHz.

DETAILED DESCRIPTION

<Introduction>

Prior to description of one embodiment of the present disclosure, the structure to conveniently ensure stability of output and problems arising with the structure when an LC filter is provided in an output stage of a class-D amplifier is described.

Figure 10:
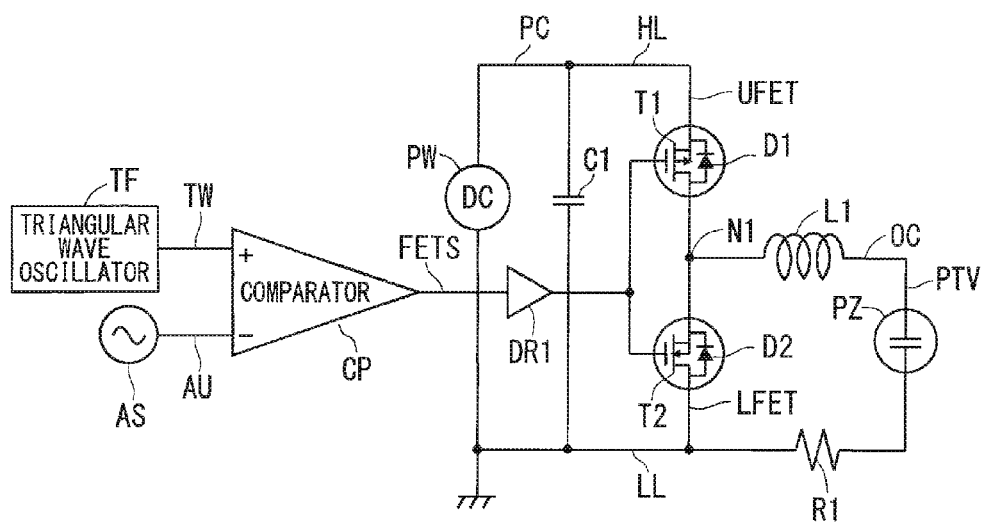
FIG. 10 illustrates the structure to conveniently ensure stability of output of a class-D amplifier.

FIG. 10 illustrates the structure of a class-D amplifier 90 that includes, as a sound-producing device, a speaker (piezoelectric speaker) configured by a piezoelectric element.

As illustrated in FIG. 10, the class-D amplifier 90 includes a triangular wave oscillator TF, an audio signal source AS, a comparator CP, and a gate drive circuit DR1. The comparator CP receives, as input, a triangular wave TW output from the triangular wave oscillator TF and an audio signal AU output from the audio signal source AS, and performs pulse width modulation (PWM) on them for output. The gate drive circuit DR1 receives, as input, a switching signal FETS output from the comparator CP. The comparator CP can be referred to as a pulse width modulator as it generates the pulse width modulated switching signal FETS based on the triangular wave TW and the audio signal AU.

The class-D amplifier 90 further includes, as output transistors, a MOS transistor T1 of a P-channel type and a MOS transistor T2 of an N-channel type that are connected in series in the stated order between a high-potential side power supply line HL and a low-potential side power supply line LL. A node at which the MOS transistors T1 and T2 are connected is an output node N1. Output of the gate drive circuit DR1 is connected to both of the gates of the MOS transistors T1 and T2, and the MOS transistors T1 and T2 complementarily perform switching operation in accordance with the output of the gate drive circuit DR1 to constitute an output circuit.

Diodes D1 and D2 are respectively connected in anti-parallel to the MOS transistors T1 and T2, which are switching devices. The diodes D1 and D2 each function as a freewheeling diode.

A direct-current (DC) power supply PW applies power supply potential to the high-potential side power supply line HL. The low-potential side power supply line LL is connected to output on a low-potential side of the DC power supply PW, and is also connected to ground potential. A capacitor C1 is connected between the high-potential side power supply line HL and the low-potential side power supply line LL.

An inductor L1, a piezoelectric speaker PZ, and a resistor R1 are connected in series in the stated order to the output node N1 of the MOS transistors T1 and T2. An end of the resistor R1 opposite the end connected to the piezoelectric speaker PZ is connected to a junction of the low-potential side power supply line LL and the MOS transistor T2.

As described above, in the class-D amplifier 90, the piezoelectric speaker PZ is equivalent to a capacitor, and thus the inductor L1 and the piezoelectric speaker PZ constitute an LC filter. In order to suppress resonance caused by the LC filter, the resistor R1 is connected in series to the LC filter to stabilize the output circuit.

When the resistor R1 is provided, however, much of energy stored in the piezoelectric speaker PZ, which is the capacitor, is consumed by the resistor R1, resulting in significant reduction of energy regenerated to the side of the power supply.

The class-D amplifier according to the present disclosure described below does not greatly reduce energy regenerated to the side of the power supply, and can suppress destabilization of the output caused due to resonance caused by the LC.

<Embodiments>

Figure 1:
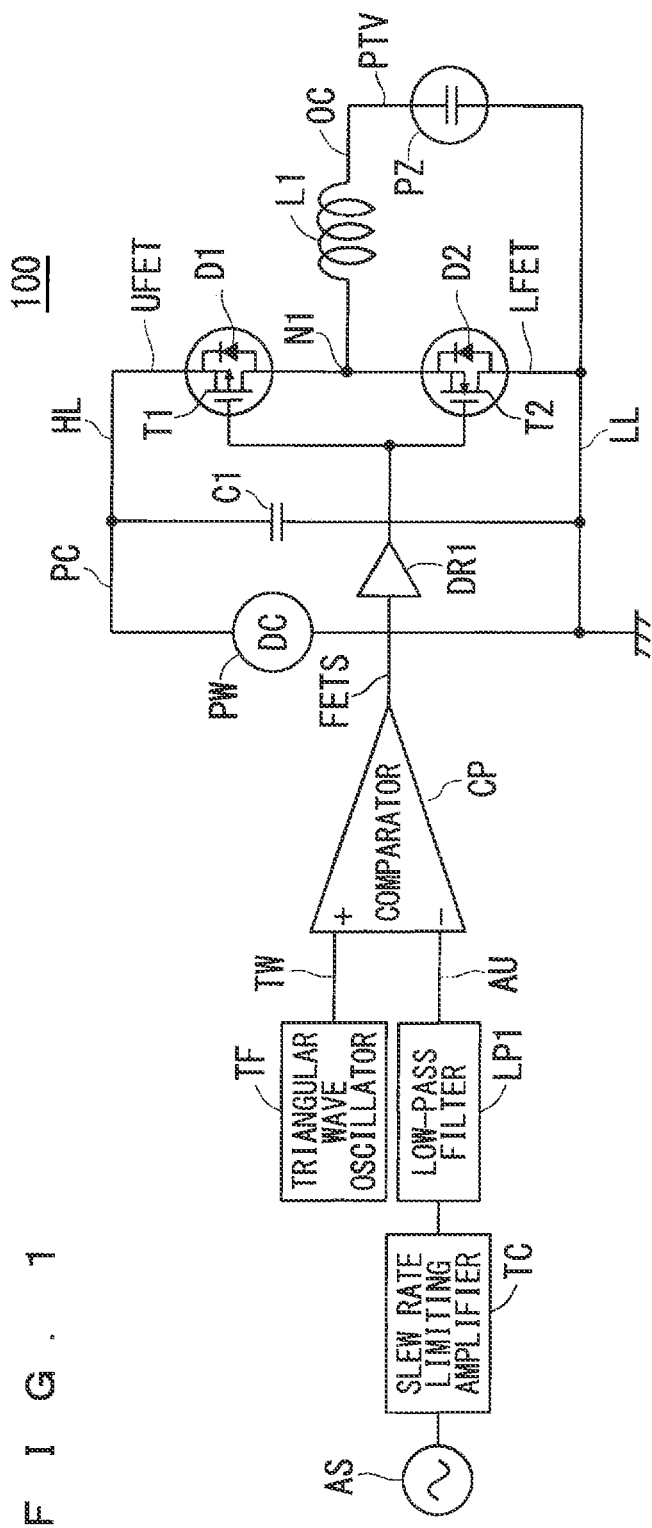
FIG. 1 illustrates the structure of a class-D amplifier in one embodiment of the present disclosure.

FIG. 1 illustrates the structure of a class-D amplifier 100 in one embodiment of the present disclosure that includes, as a sound-producing device, a piezoelectric speaker.

<Apparatus Structure>

As illustrated in FIG. 1, the class-D amplifier 100 includes a triangular wave oscillator TF, an audio signal source AS, a slew rate limiting amplifier TC, a low-pass filter LP1, a comparator CP, and a gate drive circuit DR1. The slew rate limiting amplifier TC receives output of the audio signal source AS. The low-pass filter LP1 receives output of the slew rate limiting amplifier TC. The comparator CP receives, as input, a triangular wave TW output from the triangular wave oscillator TF and an audio signal AU output from the low-pass filter LP1, and performs pulse width modulation on them for output. The gate drive circuit DR1 receives, as input, a switching signal FETS output from the comparator CP.

The class-D amplifier 100 further includes, as output transistors, a MOS transistor T1 of a P-channel type and a MOS transistor T2 of an N-channel type that are connected in series in the stated order between a high-potential side power supply line HL and a low-potential side power supply line LL. A node at which the MOS transistors T1 and T2 are connected is an output node N1. Output of the gate drive circuit DR1 is connected to both of the gates of the MOS transistors T1 and T2, and the MOS transistors T1 and T2 complementarily perform switching operation in accordance with the output of the gate drive circuit DR1 to constitute an output circuit.

Diodes D1 and D2 are respectively connected in anti-parallel to the MOS transistors T1 and T2. The diodes D1 and D2 each function as a freewheeling diode.

A DC power supply PW applies power supply potential to the high-potential side power supply line HL. The low-potential side power supply line LL is connected to output on a low-potential side of the DC power supply PW, and is also connected to ground. A capacitor C1 is connected between the high-potential side power supply line HL and the low-potential side power supply line LL.

An inductor L1 and a piezoelectric speaker PZ are connected in series in the stated order to the output node N1 of the MOS transistors T1 and T2. An end of the piezoelectric speaker PZ opposite the end connected to the inductor L1 is connected to a junction of the low-potential side power supply line LL and the MOS transistor T2.

<Operation>

Figure 2:
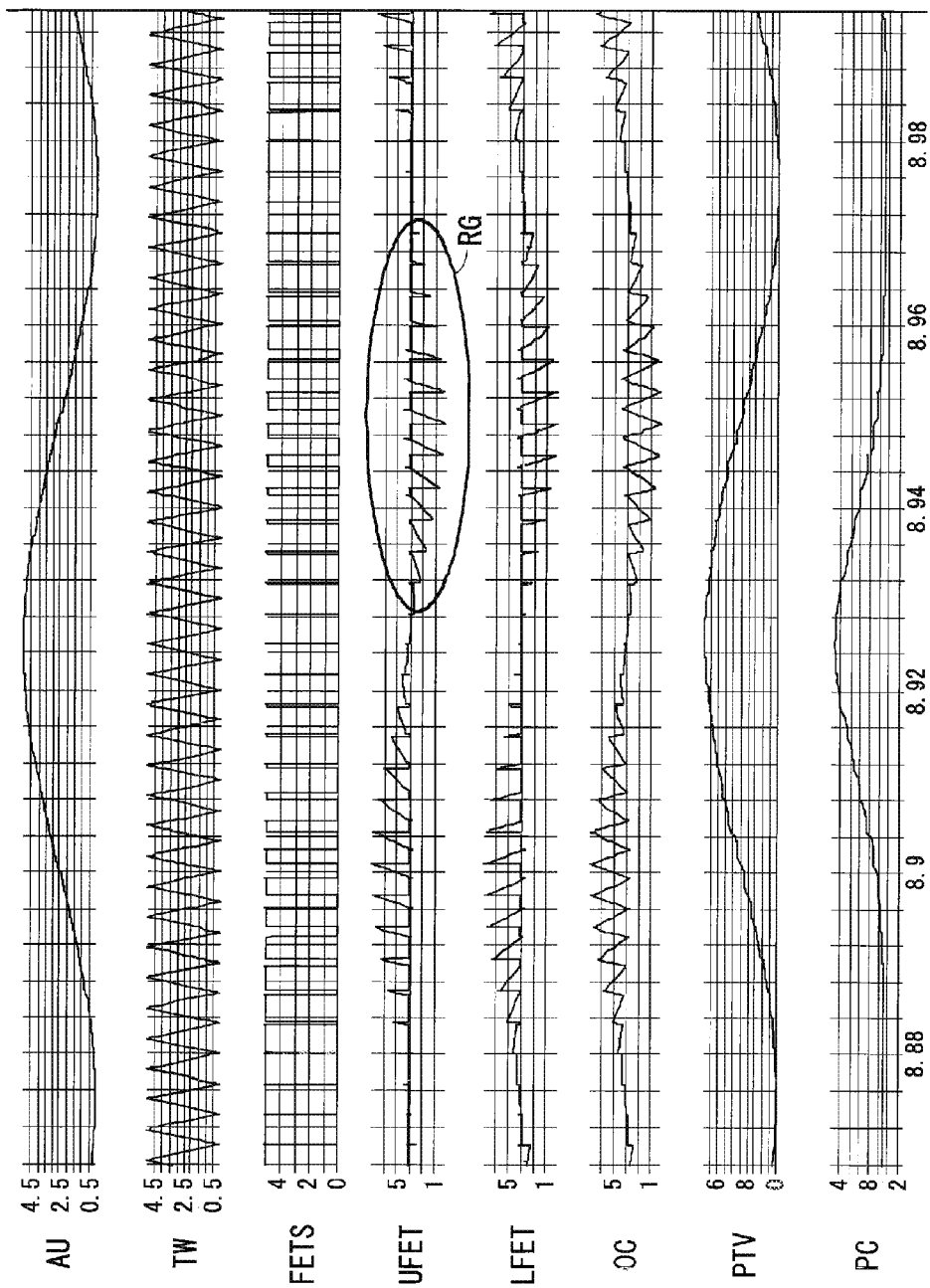
FIG. 2 illustrates a timing chart describing operation of the class-D amplifier in one embodiment of the present disclosure.

Operation performed when a sine wave is input into the class-D amplifier 100 having the above-mentioned structure is described with use of the timing chart of FIG. 2.

FIG. 2 illustrates, from the top, waveform diagrams of the audio signal AU, the triangular wave TW, the switching signal FETS, main current UFET of the MOS transistor T1, main current LFET of the MOS transistor T2, output current OC of the output circuit, a terminal voltage PTV of the piezoelectric speaker PZ, and power supply current PC of the DC power supply PW. In each of the waveform diagrams, the units on the horizontal axis are in milliseconds, and are marked every 20 μsec, and the vertical axis represents a voltage value or a current value in given units.

As can be seen from FIG. 2, in the first half of the cycle of the audio signal AU provided in a sine wave, during a time period (a time period in which the switching signal FETS is at a low potential) in which the MOS transistor T1 is intermittently switched on based on the pulse width modulated switching signal FETS (the same as the gate drive circuit DR1), the main current UFET flows from the DC power supply PW to the MOS transistor T1 through the high-potential side power supply line HL, the main current UFET flows from the output node N1 to the piezoelectric speaker PZ through the inductor L1, and electrical energy is stored in the inductor L1 and the piezoelectric speaker PZ, which is equivalent to the capacitor.

In the first half of the cycle of the audio signal AU, during a time period (a time period in which the switching signal FETS is at a high potential) in which the MOS transistor T1 is switched off and the MOS transistor T2 is switched on, current flows from the inductor L1 to the piezoelectric speaker PZ to move electrical energy stored in the inductor L1 to the piezoelectric speaker PZ.

In the first half of the cycle of the audio signal AU, during a time period (a time period in which the switching signal FETS is at a high potential) in which the MOS transistor T2 is intermittently switched on based on the pulse width modulated switching signal FETS, current from the piezoelectric speaker PZ flows as the main current LFET of the MOS transistor T2 through the inductor L1, and flows into the ground through the low-potential side power supply line LL.

In this case, electrical energy stored in the piezoelectric speaker PZ is stored in the inductor L1, and, during a time period (a time period in which the switching signal FETS is at a low potential) in which the MOS transistor T1 is switched on in the second half of the cycle of the audio signal AU, the main current UFET flows from the inductor L1 to the MOS transistor T1 through the output node N1 in a reverse direction so as to be regenerated current RG, and is regenerated to the side of the power supply and stored in the capacitor C1.

As described above, in the first half of the cycle of the audio signal AU, electrical energy is provided from the DC power supply PW to the piezoelectric speaker PZ, but, in the second half of the cycle, energy stored in the piezoelectric speaker PZ is regenerated to the side of the power supply.

In this case, when a resistance component as shown in FIG. 10 is provided on a path along which current flows from the DC power supply PW to the piezoelectric speaker PZ, electrical energy is consumed by the resistance component, resulting in reduction of regenerated energy. In the class-D amplifier 100, however, the amount of consumed electrical energy is small as the resistance component is only a collateral resistance component, such as wiring resistance.

As described above, power is regenerated and power consumption can be reduced by connecting the inductor L1 and the piezoelectric speaker PZ in series to the output circuit of the class-D amplifier. However, the Q value of an LC resonant circuit constituted by the inductor L1 and the piezoelectric speaker PZ is increased by reducing the resistance component of the LC circuit as much as possible.

At and around resonance frequency, gain of the class-D amplifier increases significantly, and operation is destabilized. The resonance frequency is usually higher than a frequency in an audio band. For example, the resonance frequency is approximately 50 kHz when capacitance of the piezoelectric speaker PZ is 1 µF, and inductance of the inductor L1 is 10 µH.

The gain of the class-D amplifier greatly changes when a signal having the same frequency component as the resonance frequency is input into the class-D amplifier.

FIG. 3 illustrates an example of frequency characteristics of the class-D amplifier when the signal having the same frequency component as the resonance frequency is input. In FIG. 3, the horizontal and vertical axes respectively represent frequency (Hz) and gain (dB), and it is shown that the gain rapidly increases at and around a frequency of 50 kHz.

Although a normal signal in the audio band does not include a signal having a frequency of 50 kHz, the signal having a frequency of 50 kHz might be input due to noise and the like generated when an input signal is switched.

To address the problem, FIG. 4 illustrates operating characteristics of a low-pass filter having frequency characteristics of cutting signal components at and around a frequency of 50 kHz. In FIG. 4, the horizontal and vertical axes respectively represent frequency (Hz) and gain (dB), and it is shown that the gain rapidly decreases at and around a frequency of 50 kHz.

<Effects>
<Effects Produced by Low-Pass Filter>

In the class-D amplifier 100, the low-pass filter LP1 having operating characteristics as shown in FIG. 4 is provided to an input part of the comparator CP to prevent the signal having the same frequency component as the resonance frequency from being input into the class-D amplifier. The structure of the low-pass filter LP1 is not particularly limited, and the low-pass filter LP1 may be a passive filter, an active filter, and a digital filter.

This yields the class-D amplifier that suppresses destabilization of output caused due to LC resonance, and eliminates the need to connect a resistance element to the LC circuit. As a result, significant consumption of electrical energy to be regenerated to the side of the power supply is suppressed, and power consumption can be reduced.

<Effects Produced by Slew Rate Limiting Amplifier>

In the class-D amplifier 100, the slew rate limiting amplifier TC is provided in the preceding stage of the low-pass filter LP1, and limits maximum current flowing through the inductor L1 to achieve reduction in size of the inductor L1 and to thereby achieve cost reduction.

That is to say, in the class-D amplifier 100, the LC series circuit is connected to the output circuit to obtain the regenerated current.

In this case, a maximum value $I_{max}$ of the output current is expressed by the following formula (1).

[Math 1]

$$I_{max} = \left(\frac{dQ}{dt}\right)_{max} = C\left(\frac{dV}{dt}\right)_{max} \quad (1)$$

In the above-mentioned formula (1), C denotes capacitance of the piezoelectric speaker PZ.

When maximum frequency of an output signal of the class-D amplifier is represented by $f_{max}$, maximum output amplitude is represented by $V_{pp}$, and voltage is represented by V, the following formula (2) is satisfied herein.

[Math 2]

$$\left|\frac{dV}{dt}\right| \leq 2\pi \cdot f_{max} \cdot V_{pp} \quad (2)$$

The following formula (3) is obtained from the formulae (1) and (2).

[Math 3]

$$I_{max} = 2\pi \cdot f_{max} \cdot C \cdot V_{pp} \quad (3)$$

As can be understood from the above-mentioned formula (3), when the upper limit of the maximum frequency is raised, the maximum current flowing through the inductor L1 is increased, and this makes it necessary to increase the size of the inductor L1, leading to a higher cost.

As for a normal audio signal, however, energy of a high-frequency component is actually relatively low, and, when gain is set to 0.2, for example, it has little effect on actual listening. A constraint expressed by the following formula (4) is thus considered.

[Math 4]

$$I_{max} = 2\pi \cdot f_{max} \cdot C \cdot V_{pp} \cdot A \quad (4)$$

In the above-mentioned formula (4), A denotes the gain. By setting A so that A=0.2 is satisfied, the maximum current can be reduced to one fifth. This constraint can be achieved by providing, in an input stage of the class-D amplifier, the slew rate limiting amplifier TC in which a slew rate (dV/dt) is limited.

An amplifier adjusted so that a slew rate of output of the amplifier becomes $2\pi \cdot f_{max} \cdot V_{pp} \cdot 0.2$ is used as the slew rate limiting amplifier TC.

Consequently, the maximum current flowing through the inductor L1 is limited to one fifth to achieve reduction in size of the inductor L1 and to thereby achieve cost reduction.

Figure 5:
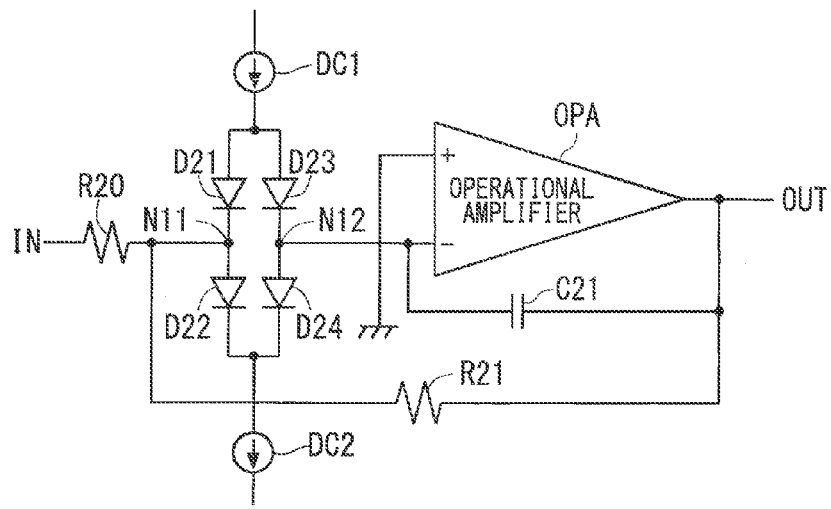
FIG. 5 illustrates the structure of a slew rate limiting amplifier.

FIG. 5 illustrates an example of the structure of the slew rate limiting amplifier TC. As illustrated in FIG. 5, in the slew rate limiting amplifier TC, series-connected diodes D21 and D22 and series-connected diodes D23 and D24 are connected in parallel to each other between constant current sources DC1 and DC2, and an input signal IN is input, through a resistor R20, into a node N11 at which the diodes D21 and D22 are connected.

A node N12 at which the diodes D23 and D24 are connected is connected to inverting input (negative input) of an operational amplifier OPA, and an output signal OUT is output from an output part of the operational amplifier OPA.

Non-inverting input (positive input) of the operational amplifier OPA is connected to ground, and the inverting input of the operational amplifier OPA is connected to the output part of the operational amplifier OPA through a capacitor C21. The output part of the operational amplifier OPA is also connected, through a resistor R21, to the node N11 at which the diodes D21 and D22 are connected.

Figure 6:
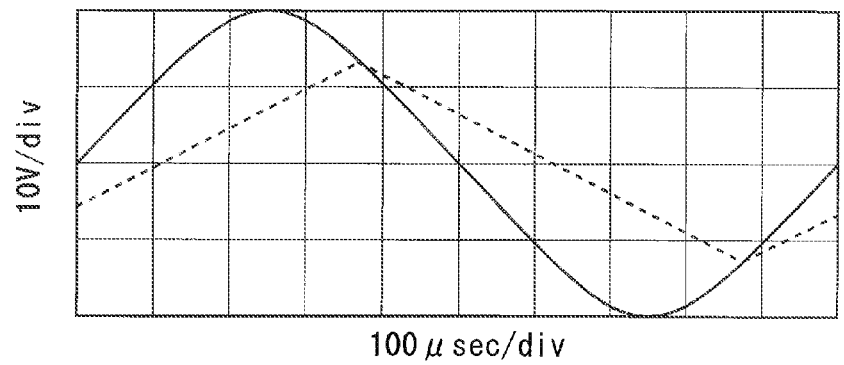
FIG. 6 illustrates slew rate limiting operation performed by the slew rate limiting amplifier.
Figure 7:
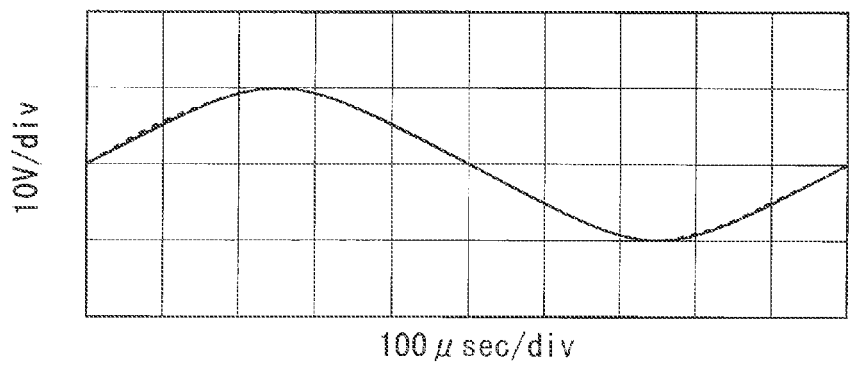
FIG. 7 illustrates the slew rate limiting operation performed by the slew rate limiting amplifier.

An example of slew rate limiting operation performed by the slew rate limiting amplifier TC having the above-mentioned structure is described with use of FIGS. 6 and 7.

In each of FIGS. 6 and 7, the horizontal and vertical axes respectively represent time (100 μsec/div) and voltage (10 V/div), and a sine wave having a frequency of 1 kHz is shown in a solid line. FIG. 6 shows a case where amplitude of the sine wave is 40 Vp-p. FIG. 7 shows a case where amplitude of the sine wave is 20 Vp-p.

FIG. 6 shows, in a dashed line, a result of inputting the sine wave having an amplitude of 40 Vp-p shown in FIG. 6 into the slew rate limiting amplifier TC in which a maximum slew rate is limited to 10 V/200 μsec, and the gain is 0 dB.

As shown in FIG. 6, output of the slew rate limiting amplifier TC is a triangular wave shown in the dashed line as most part of the sine wave exceeds the slew rate limit.

On the other hand, when the sine wave having an amplitude of 20 Vp-p shown in FIG. 7 is input into the slew rate limiting amplifier TC in which the maximum slew rate is limited to 10 V/200 μsec, and the gain is 0 dB, output of the slew rate limiting amplifier TC is exactly the same as the input sine wave as shown in a dashed line as most part of the sine wave does not exceed the slew rate limit.

When the slew rate limiting operation is performed as described above, limitation is imposed only when the amplitude of input is large, and is not imposed when the amplitude of input is small.

The amplitude of the high-frequency component, which increases the slew rate, is typically small in actual music and sound, and effects of distortion caused by the slew rate limitation are negligible.

<Modification 1>

Although the class-D amplifier 100 in one embodiment described above is a half bridge class-D amplifier, the class-D amplifier 100 may be a full bridge class-D amplifier.

Figure 8:
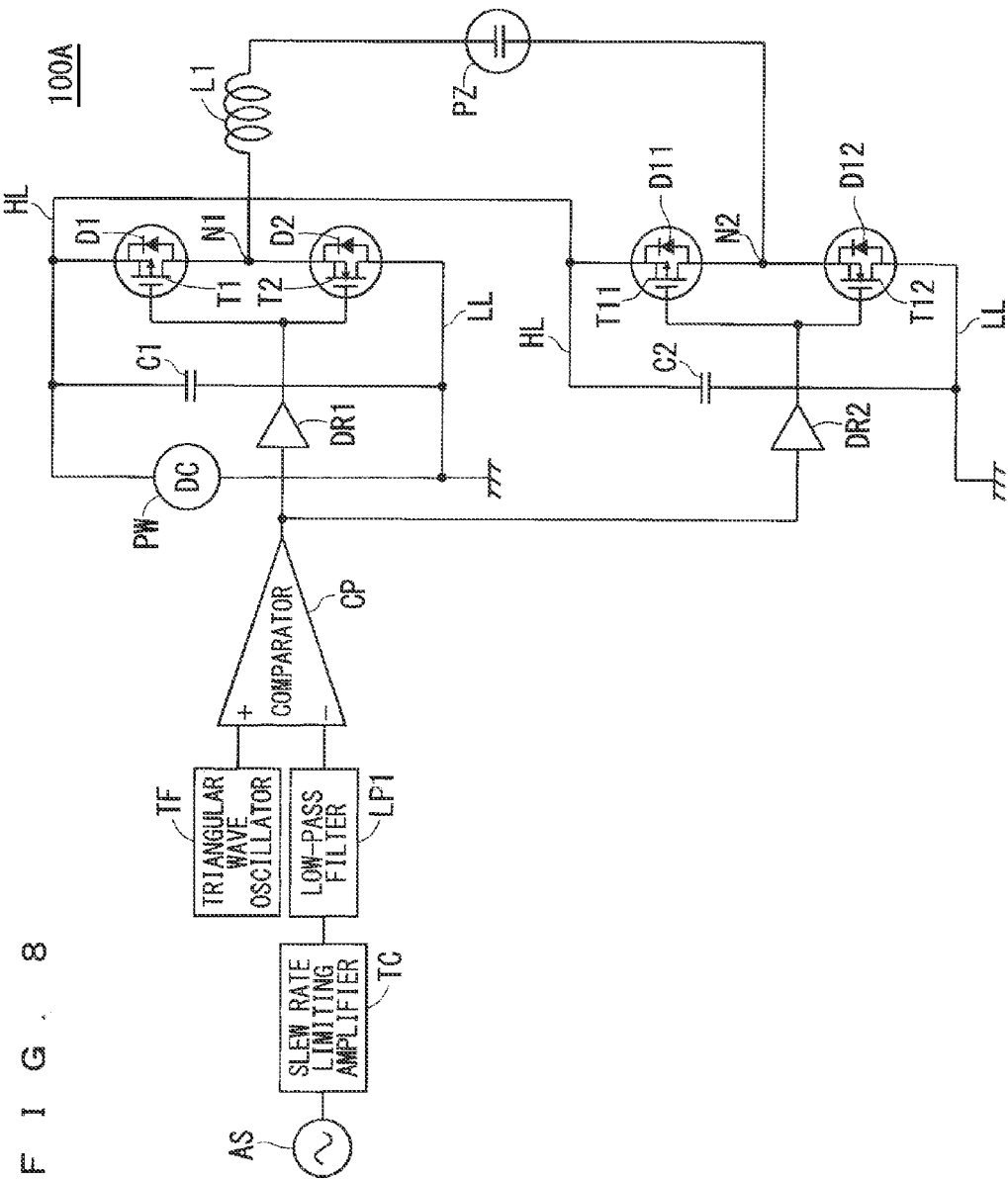
FIG. 8 illustrates the structure of a class-D amplifier in Modification 1 of one embodiment of the present disclosure.

FIG. 8 illustrates the full bridge class-D amplifier as a class-D amplifier 100A. The same components as the class-D amplifier 100 shown in FIG. 1 bear the same reference signs in FIG. 8, and description thereof is omitted.

The class-D amplifier 100A shown in FIG. 8 includes, as output transistors, a MOS transistor T11 of a P-channel type and a MOS transistor T12 of an N-channel type that are connected in series in the stated order between the high-potential side power supply line HL and the low-potential side power supply line LL, in addition to the MOS transistors T1 and T2. A node at which the MOS transistors T11 and T12 are connected is an output node N2.

The switching signal FETS output from the comparator CP is input into a gate drive circuit DR2 in addition to the gate drive circuit DR1. Output of the gate drive circuit DR2 is connected to both of the gates of the MOS transistors T11 and T12, and the MOS transistors T11 and T12 complementarily perform switching operation in accordance with the output of the gate drive circuit DR2 to constitute an output circuit.

Diodes D11 and D12 are respectively connected in anti-parallel to the MOS transistors T11 and T12. The diodes D11 and D12 each function as a freewheeling diode.

A capacitor C2 is connected between the high-potential side power supply line HL to which the MOS transistor T11 is connected and the low-potential side power supply line LL to which the MOS transistor T12 is connected.

The end of the piezoelectric speaker PZ opposite to the end connected to the inductor L1 is connected to the output node N2 of the MOS transistors T11 and T12.

Also in the class-D amplifier 100A having the above-mentioned structure, the low-pass filter LP1 is provided to the input part of the comparator CP to prevent the signal having the same frequency component as the resonance frequency from being input into the class-D amplifier. This yields the class-D amplifier that suppresses destabilization of output caused due to LC resonance, and eliminates the need to connect the resistance element to the LC filter connected to the output circuit. As a result, significant consumption of electrical energy to be regenerated to the side of the power supply is suppressed, and power consumption can be reduced.

Furthermore, the slew rate limiting amplifier TC is provided in the preceding stage of the low-pass filter LP1, and limits the maximum current flowing through the inductor L1 to achieve reduction in size of the inductor L1 and to thereby achieve cost reduction.

<Modification 2>

In the class-D amplifier 100 in one embodiment and the class-D amplifier 100A in Modification 1 of one embodiment described above, the low-pass filter LP1 is provided to the input part of the comparator CP. The low-pass filter LP1, however, may not be provided when the possibility that the input signal having the same frequency as the resonance frequency of the LC series circuit connected to the output circuit of the class-D amplifier is input is low, and, even if the input signal is input, the effect is eliminated in a short time period.

Figure 9:
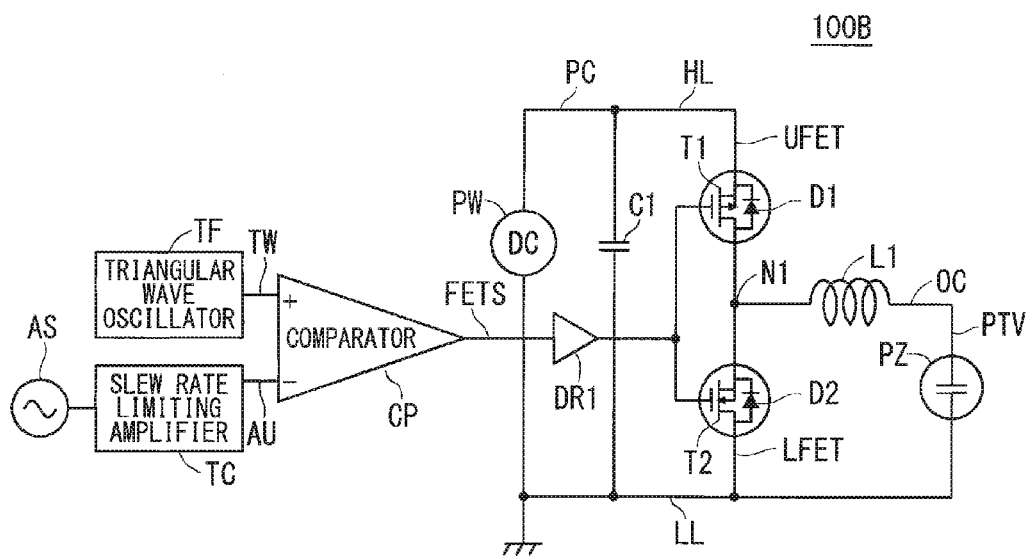
FIG. 9 illustrates the structure of a class-D amplifier in Modification 2 of one embodiment of the present disclosure.

That is to say, in a class-D amplifier 100B shown in FIG. 9, the slew rate limiting amplifier TC is connected to the input part of the comparator CP, and the low-pass filter is not provided. The same components as the class-D amplifier 100 shown in FIG. 1 bear the same reference signs in FIG. 9, and description thereof is omitted.

As described above, in the class-D amplifier 100B, the low-pass filter is not provided to the input part, so that input of the signal having the same frequency component as the resonance frequency into the class-D amplifier cannot be prevented. However, the slew rate limiting amplifier TC is provided to the input part, so that the maximum current flowing through the inductor L1 is limited to achieve reduction in size of the inductor L1 and to thereby achieve cost reduction.

Embodiments of the present disclosure can appropriately be modified and omitted within the scope of the present disclosure. The class-D amplifier 100 in one embodiment and the class-D amplifier 100A in Modification 1 of one embodiment described above are applicable to an appropriate electronic apparatus, such as a mobile phone, a PHS, a PDA, a game machine, an audio terminal, and an electronic book.

The invention claimed is:

1. A class-D amplifier that drives a sound-producing device serving as a capacitive load, the class-D amplifier comprising:
    a first output circuit including a first switching device and a second switching device that are connected in series between a first power supply line and a second power supply line, and complementarily operate, the first power supply line providing first potential, the second power supply line providing second potential lower than the first potential, wherein the sound-producing device is connected in series to an inductor connected to a first output node of the first output circuit, and wherein the sound-producing device and the inductor constitute an LC filter;

a first capacitor connected between the first power supply line and the second power supply line;

a pulse width modulator generating a pulse width modulated switching signal based on a triangular wave and an audio signal, and providing the switching signal to the first output circuit;

a slew rate limiting amplifier connected to an input part of the pulse width modulator to which the audio signal is provided, and limiting a slew rate of output; and a low-pass filter provided between the slew rate limiting amplifier and the input part of the pulse width modulator, wherein the low-pass filter prevents a signal having a same frequency component as a resonance frequency of the LC filter from being input to the pulse width modulator.

2. The class-D amplifier according to claim 1, wherein the LC filter is a circuit between the output node and the second power supply line.

3. The class-D amplifier according to claim 1, further comprising:

a second output circuit including a third switching device and a fourth switching device that are connected between the first power supply line and the second power supply line, and complementarily operate; and a second capacitor connected between the first power supply line and the second power supply line, wherein the pulse width modulator provides the switching signal to the second output circuit, and the LC filter is a circuit between the first output node and a second output node of the second output circuit.

4. An electronic apparatus comprising the class-D amplifier according to claim 1.

* * * * *